US009417097B2

(12) United States Patent
Robert et al.

(10) Patent No.: US 9,417,097 B2
(45) Date of Patent: Aug. 16, 2016

(54) DEVICE FOR MEASURING MAGNETIC FIELDS WITH LAPLACE FORCE

(71) Applicant: Commissariat à l'énergie atomique et aux énergies alternatives, Paris (FR)

(72) Inventors: Philippe Robert, Grenoble (FR); Dirk Ettelt, Gelsenkirchen (DE); Arnaud Walther, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/423,831

(22) PCT Filed: Aug. 29, 2013

(86) PCT No.: PCT/EP2013/067857
§ 371 (c)(1),
(2) Date: Feb. 25, 2015

(87) PCT Pub. No.: WO2014/033194
PCT Pub. Date: Mar. 6, 2014

(65) Prior Publication Data
US 2015/0211891 A1 Jul. 30, 2015

(30) Foreign Application Priority Data

Aug. 29, 2012 (FR) .................................. 12 58056

(51) Int. Cl.
*G01B 7/30* (2006.01)
*G01D 5/14* (2006.01)
*G01R 33/028* (2006.01)
*G01R 33/038* (2006.01)

(52) U.S. Cl.
CPC .............. *G01D 5/14* (2013.01); *G01R 33/0286* (2013.01); *G01R 33/038* (2013.01)

(58) Field of Classification Search
CPC ........... G01D 5/14; G01D 5/12; G01R 33/38; G01R 33/22; G01R 33/283; G01R 33/286
See application file for complete search history.

(56) References Cited

U.S. PATENT DOCUMENTS 6,215,318 B1 * 4/2001 Schoefthaler ...... G01R 33/0035
324/658
6,664,786 B2 * 12/2003 Kretschmann ..... G01R 33/0286
324/207.14

(Continued)

FOREIGN PATENT DOCUMENTS

FR 2983844 A1 6/2013

OTHER PUBLICATIONS

Herrera-May et al., "A resonant magnetic field microsensor with high quality factor at atmospheric pressure," J Micromech Microeng, vol. 19 (2009).

(Continued)

*Primary Examiner* — Minh N Tang
(74) *Attorney, Agent, or Firm* — Occhiuti & Rohlicek LLP

(57) ABSTRACT

A device for measuring magnetic fields with Laplace force, comprising a substrate extending in a substrate plane, a first rigid frame in a first plane moveable relative to the substrate about a first rotation axis parallel to the substrate plane with a central through-recess. There is a fixed electrical conductor wound an axis perpendicular to the plane of the first frame. There a first hinge connecting the first rigid frame to the substrate with a first electrical track. There is a second hinge connected to the first rigid frame with a second electrical track. There is a first sensor for measuring of the angular displacement of the first rigid frame. The first hinge and the first electrical track are inside the central recess of the first rigid frame and the second hinge and the second electrical track are outside the central recess of the first rigid frame.

14 Claims, 6 Drawing Sheets

(56) References Cited

U.S. PATENT DOCUMENTS

| | | |
|---|---|---|
| 7,642,692 B1 | 1/2010 | Pulskamp |
| 2006/0076947 A1 | 4/2006 | Berkcan et al. |
| 2011/0304325 A1 | 12/2011 | Walther et al. |

OTHER PUBLICATIONS

Kyynäräinen et al., "A 3D micromechanical compass," Sensors and Actuators A, vol. 142, pp. 561-568 (2008).

* cited by examiner

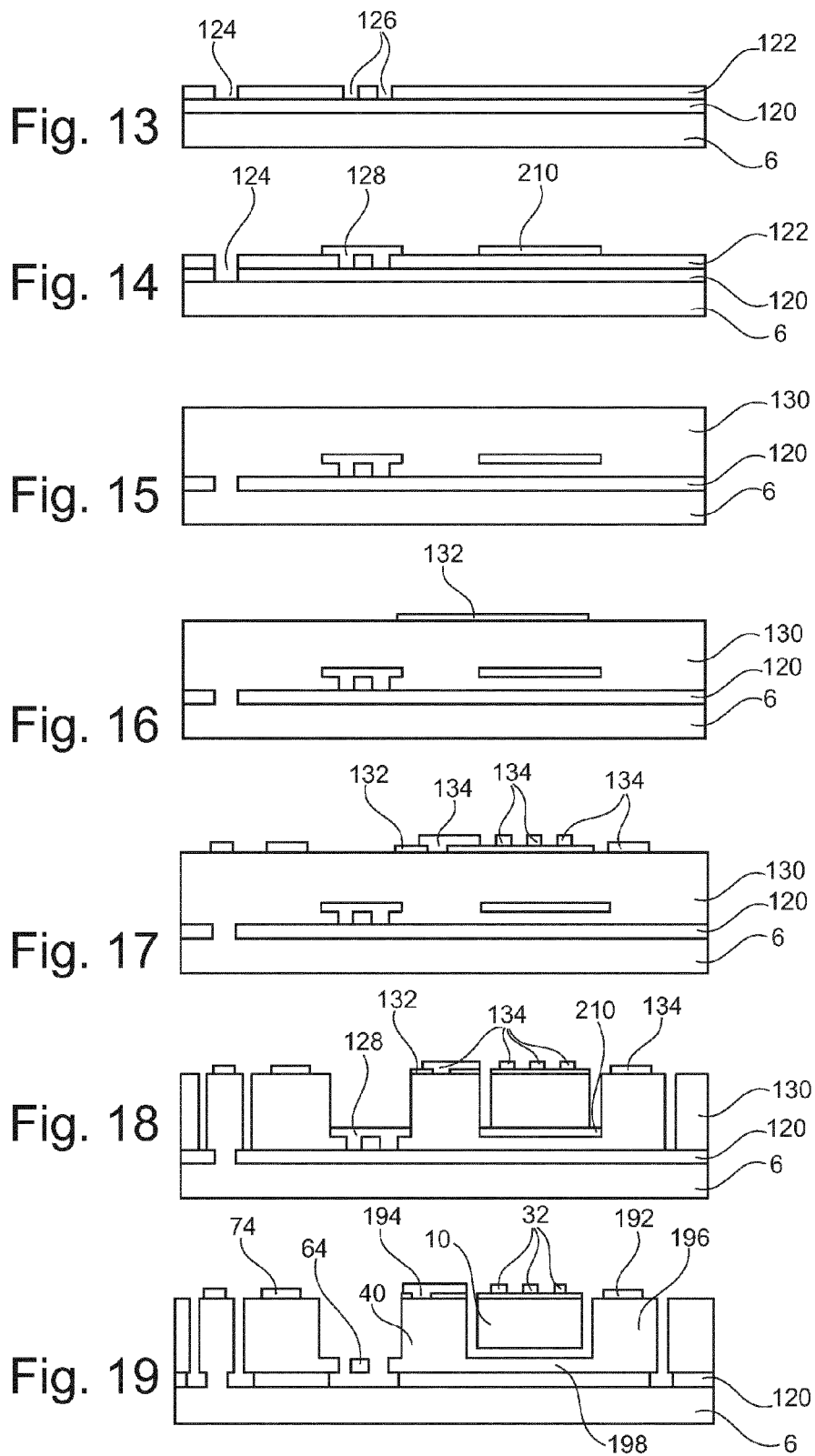

DEVICE FOR MEASURING MAGNETIC FIELDS WITH LAPLACE FORCE

RELATED APPLICATIONS

This application is a U.S. National Stage of international application number PCT/EP2013/067857 filed Aug. 29, 2013, which claims the benefit of the priority date of French Patent Application FR 1258056, filed Aug. 29, 2012, the contents of which are herein incorporated by reference.

FIELD OF INVENTION

The invention pertains to a device for measuring magnetic fields with Laplace force.

BACKGROUND

The Laplace force is also known as the Lorentz force.

Devices for measuring magnetic fields with Laplace force can be used to measure a component of the earth's magnetic field or a component of a magnetic field generated by an electrical conductor or another magnetic field source.

The term "component of the magnetic field" designates the amplitude of the orthogonal projection of the magnetic field on a measurement axis of the measuring device.

Prior-art measurement devices comprise:
a substrate extending essentially in a plane called the "plane of the substrate",
a first rigid frame extending essentially in a plane called the "plane of the first frame" and suspended above the substrate, this first frame being movable relative to the substrate in rotation about a first rotation axis parallel to the plane of the substrate,
an electrical conductor fixed, with no degree of freedom, to the first rigid frame, this conductor being wound about a winding axis perpendicular to the plane of the first frame,
at least one first hinge mechanically connecting the rigid frame to the substrate, and
at least one first strain sensor or strain gauge sensor capable of measuring a physical quantity representing the amplitude of the angular displacement of the first rigid frame about its rotation axis.

For example, such a measuring device is described in the following article A1:
A. L. Herrera-May et al, "*A resonant magnetic field microsensor with high quality factor at atmospheric pressure*", J. Micromechanical Microengineering, 19 (2009) 015016.

The measuring device of A1 works accurately. However, it is desirable to improve its sensitivity.

The following are also known in the prior art:
US2011/304325A1,
U.S. Pat. No. 7,642,692B1,
US2006/076947A1.

Until now, it has proved to be difficult to make the connection of the fixed electrical conductor to the first rigid frame. Because of these difficulties, the known devices for measuring Laplace force magnetic fields adopt a particular conformation which limits the number of turns of the electrical conductor to less than a single turn. It is desirable however to have a conformation of the measuring device that does not limit the number of turns of the electrical conductor.

SUMMARY

An object of the invention therefore is a device for measuring Laplace force magnetic fields compliant with claim 15.

In the above device, because of the particular position of the hinges and especially because the first hinge is placed inside the central recess and the second hinge outside this recess, the connection of the ends of the electrical conductor to the connection pads raises no problem even if this conductor is wound several times about the winding axis. In addition, this particular disposition of the hinges is simple to achieve by means of the techniques for manufacturing microelectronic chips.

In one particular embodiment, the measuring device comprises the characteristics of claim 16.

In this case, the beam of the sensor is directly fixed, by one side, to the first rigid frame and, by another side, to the substrate. Thus, the rigid frame forms a lever which, to a correspondingly greater extent, amplifies the Laplace force exerted by the first end of the beam that is proximate to the rotation axis. Here, the first end of the beam is far closer to the rotation axis than the position at which the Laplace force is applied on the first frame. Thus, this particular conformation of the measuring device enables amplification by a factor of at least two of the Laplace force measured by the sensor and therefore increases its sensitivity to this measuring device as compared with the device described in A1.

Indeed, in the case of the measuring device of A1, the strain sensors are integrated into flexible lateral strips enabling the frame to pivot about its rotation axis. This means that, for the sensors to measure a variation in strain, the strips should be deformable. If not, the sensors would measure no signals. Thus, since each strip is deformable, no direct benefit is obtained from a mechanical effect of a lever arm in the case of the measuring device of A1. This explains why the measuring device of A1 is less sensitive than the one described here above.

In addition, since the sensor is mechanically separated from the frame and the hinge, it is easier to optimize the dimensions of the above measuring device. For example, each element can be sized individually to attain a given mechanical resonance frequency for the measuring device. Here, modifications in the dimensions of one of the elements do not necessarily lead to modifying the dimensions of the other elements. Conversely, the mechanical resonance frequency of the measuring device of A1 is hard to adjust. Indeed, in the measuring device of A1, the different parameters that can be played upon to obtain a desired resonance frequency of the frame are intimately related to the sensitivity of the measuring device. For example, the stiffness of the hinges cannot be modified without modifying the sensitivity of the measuring device. Indeed, the sensors used to measure the angular displacement of the frame are directly fixed to the flexible lateral strips. Thus, increasing the stiffness of the strips leads to limiting the sensitivity of the device for measuring A1.

The embodiments of this measuring device can thus comprise one or more characteristics of the other dependent claims.

These embodiments of the measuring device furthermore have the following advantages:
placing the center of gravity of the frame in a plane perpendicular to the plane of the frame and containing its rotation axis makes the measuring device insensitive to the accelerations perpendicular to the plane of the substrate;
using a lateral branch and a suspended beam, parallel to the plane of the substrate, the end of which is connected to this lateral branch, increases the sensitivity of the measuring device because in this conformation, the beam essentially undergoes tension-compression and practically no bending or flexure;

using a notch in the lateral branch to bring the first end of the beam closer to the rotation axis further limits the work of the beam under bending forces;

using two copies of the first hinge mechanically connected to different arms of the first frame reduces the sensitivity of the measuring device to accelerations perpendicular to the plane of the substrate;

using an electrical track that passes beneath the rigid frame to electrically connect the electrical conductor to a connection pad situated outside the frame facilitates the electrical connection of the conductor and therefore the manufacturing of the measuring device;

using a second rigid frame mounted rotationally along a rotation axis different from the first rotation axis and supporting the first rigid frame makes it possible to measure two different components of the magnetic field while at the same time using the same electrical conductor, thus for example making it possible to decrease the electrical consumption of the measuring device;

using a torsion bar to make the hinge makes it possible, in a simple way, to obtain a hinge that is flexible in torsion about the rotation axis and rigid in bending along the axes perpendicular to the this rotation axis;

using an electrical conductor that gets wound several times about the winding axis further increases the sensitivity of the measuring device.

The invention will be understood more clearly from the following description given purely by way of a non-exhaustive example and from the appended drawings.

BRIEF DESCRIPTION OF THE DRAWINGS

FIGS. 13 to 19 are schematic illustrations of different steps for manufacturing the measuring device of FIG. 12.

DETAILED DESCRIPTION

In these figures, the same references are used to designate the same elements. Here below in this description, the characteristics and functions well known to those skilled in the art are not described in detail.

Figures 1, 2:
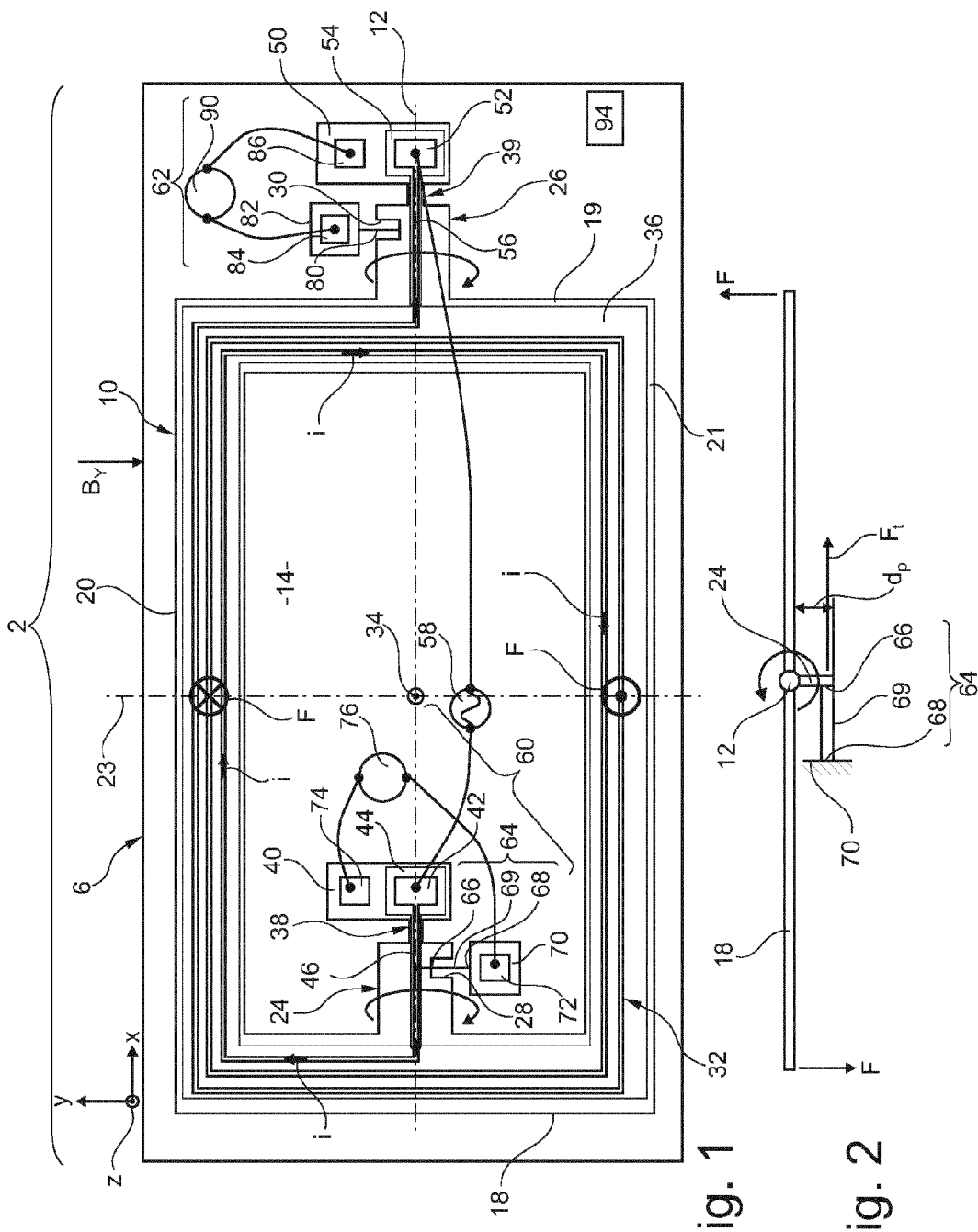
FIG. 1 is a schematic illustration in a top view of a first embodiment of a device for measuring Laplace force magnetic fields.
FIG. 2 is a schematic illustration in a side view of the measuring device of FIG. 1.

FIG. 1 is a device 2 for measuring magnetic fields with Laplace force. More specifically, this device 2 is capable of measuring the amplitude of a component $B_Y$ of the magnetic field. The component $B_Y$ is represented by an arrow. The component $B_Y$ is parallel to the plane of the drawing sheet and parallel to an axis Y of an orthogonal referential X, Y, Z. The axes X and Y are horizontal and the axis Z is vertical. Here below in this description, the terms "above", "beneath", "higher" and "lower" are defined in relation to the direction Z.

The device 2 comprises a substrate 6 that extends essentially in a horizontal plane called the "plane of the substrate". Typically, the dimensions of this substrate 6 are smaller than 1 mm$^2$. For example, its length is smaller than 1 mm or 500 µm, and its width is smaller than 500 µm or 300 µm.

The substrate 6 is made out of a material that can be machined by the techniques of microelectronics, i.e. the same techniques as those used to make electronic components such as transistors. For example, the substrate 6 is a substrate made of a semiconductor material such as silicon.

The device comprises a rigid frame 10 suspended above the substrate 6. Here, the term "suspended" designates an element mechanically isolated from the substrate 6, in the direction Z, by a recess in which vacuum is created or which is filled with a gas. The element is then capable of moving relative to the substrate 6. Here, the frame 10 is capable of moving rotationally about an axis 12 of rotation. The axis 12 is parallel to the direction X.

The frame 10 extends essentially in a plane called a plane of the frame. Here, the frame 10 has an essentially rectangular shape.

The frame 10 comprises a central through-recess 14. On either side of the recess 14, in the direction X, the frame 10 comprises rigid arms 18 and 19. Similarly, on either side of the recess 14, in the direction Y, the frame 10 comprises rigid legs 20 and 21. The arms 18 and 19 are parallel to the direction Y while the legs 20 and 21 are parallel to the direction X. The ends of the legs 20 and 21 are fixed, with no degree of freedom, by one side to the arm 18 and by the other side to the arm 19.

Here, the arm 19 is symmetrical with the arm 18 relative to a vertical plane 23. Thus, only the arm 18 is described in greater detail.

The length $Lo_{18}$ of the arm 18 in the direction Y is typically smaller than 2 mm or 500 µm and preferably greater than 50 or 100 µm. The width $La_{18}$ of the arm 18 in the direction X is smaller than $Lo_{18}/2$ or $Lo_{18}/5$. The thickness of the arm 18 is equal to the thickness $e_{CR}$ of the frame 10. The thickness $e_{CR}$ is the mean thickness of the frame 10 in the direction Z for example this thickness is strictly smaller than the width $La_{18}/2$. Here, the thickness $e_{CR}$ is smaller than 10 or 30 µm and preferably greater than 2 or 5 µm.

The leg 21 is symmetrical to the leg 20 relative to the vertical plane passing through the axis 12. This vertical plane is also a plane of symmetry for the arms 18 and 19. The length $Lo_{20}$ of the leg 20 in the direction X is typically smaller than 2 mm or 500 µm. This length $Lo_{20}$ is also preferably greater than 50 or 100 µm. The width $La_{20}$ of the leg 20 in the direction Y is smaller than $Lo_{20}/2$ or à $Lo_{20}/5$. The thickness of the leg 20 is equal to the thickness $e_{CR}$ of the frame 10.

The frame 10 is made out of rigid materials, i.e. materials for which the Young's modulus at 25° Celsius is greater than 20 GPa or 50 GPa or 100 GPa. For example, the frame 10 is made out of a semi-conductive material such as silicon.

The frame 10 also has two rigid side branches 24 and 26. These branches 24 and 26 form lateral protrusions from, respectively, the arms 18 and 19. The branch 24 extends along the axis 12 from the arm 18 towards the interior of the recess 14. The branch 26 extends along the axis 12 from the arm 19 in moving away towards the exterior of the frame 10. Here, the branches 24 and 26 form an integral block of material with, respectively, the arms 18 and 19.

The width $La_{24}$ of the branch 24 in the direction Y is herein equal to the width $La_{18}$ of the arm 18. The length $Lo_{24}$ of the branch 24 in the direction X is smaller than or equal to $Lo_{20}/2$ or $Lo_{20}/3$. The thickness of the branch 24 is equal to the thickness $e_{CR}$ of the frame 10. This branch 24 is therefore crossed from one side to the other by the axis 12.

The branch 24 comprises a notch 28 hollowed out in the direction Y. This notch 28 ends in a vertical bottom parallel to the axis 12 and situated in proximity to this axis 12. Here, the shortest distance between this vertical bottom and the axis 12 is smaller than the width $La_{24}/3$ and preferably smaller than $La_{24}/5$ or $La_{24}/10$. For example, the shortest distance is lower than 5 or 10 μm. Advantageously, this distance is zero. Here, the notch 28 is entirely situated on only one side of the vertical plane passing through the axis 12.

The branch 26 is identical to the branch 24 except that the notch 28 is replaced by a notch 30. The notch 30 is identical to the notch 28 but is entirely situated on the other side of the vertical plane passing through the axis 12.

Because of the above described layout of the frame 10, the center of gravity of this frame is situated in proximity to the axis 12 so that it has very low sensitivity to the accelerations in the directions X, Y and Z. Here, the term "situated in proximity" designates the fact that the shortest distance between the center of gravity of the frame 10 and the axis 12 is:
- smaller than the length $Lo_{18}/50$ in the direction Y, and
- smaller than the thickness $e_{CR}$ or $e_{CR}/2$ in the direction Z.

The frame 10 is said to be "rigid". Here, the term "rigid" designates the fact that its cross-section and the material out of which it is made have been chosen so that the stiffness under bending or flexure, at one point of the leg 20 and 21 to which the Laplace force to be measured is applied, in the direction of application of this Laplace force, is at least twice and preferably at least ten times or a hundred times greater than the stiffness under compression of the suspended beam of beams which also attach this frame to the substrate 6. These suspended beams are described further below. The stiffness under bending is for example measured or computed by replacing the torsion bar or bars by a corresponding anchor of infinite stiffness and having no degree of freedom. The torsion bars are described further below. For the frame 10, the direction of application of the Laplace force is parallel to the direction Z.

The device 2 also comprises an electrical conductor 32 deposited, with no degree of freedom, on the upper face of the frame 10. This conductor 32 is wound about a vertical axis 34 perpendicular to the plane of the frame 10 and intersecting the axis 12. Here, the axis 34 is appreciably at the center of the rectangular recess 14. In the FIG. 1, this axis 24 is represented by a dot in the middle of a circle.

The conductor 32 makes several full turns about the axis 34. It therefore forms a coil comprising several full turns. It is isolated from the frame 10 by a layer 36 made out of electrically insulating material. On each leg 20, 21 the conductor 32 forms rectilinear segments parallel to the direction X. Consequently, when the conductor 32 is crossed by a current in the presence of the component $B_Y$ of the magnetic field, these segments are subjected to a Laplace force F. Typically the Laplace force that gets exerted on each of the segments of the conductor 32 is given by the following relationship: $\vec{F} = i d \vec{l} \wedge \vec{B}_Y$, where:
- F is the Laplace force that is exerted on each of the rectilinear segments of the conductor 32,
- i is the intensity of the current that flows in the conductor 32,
- dl is the length of the segment of the conductor 32,
- $B_y$ is the component of the magnetic field to be measured, and
- the symbol "$\wedge$" is the vector product mathematical operation.

In FIG. 1, the direction of flow of the current in the conductor 32 is represented by arrows i. With this sense of flow, the Laplace force is exerted perpendicularly to the plane of the substrate in one sense on the leg 20 and in the opposite sense on the leg 21. Thus, the Laplace force makes the frame 10 rotate about its rotation axis 12. Consequently, the angular displacement of the frame 10 represents the intensity of the Laplace force and therefore of the component $B_y$ of the magnetic field to be measured.

To enable this rotation of the frame 10 about the axis 12, the frame 10 is directly mechanically connected to the substrate 6 by hinges. These hinges are herein the torsion bars 38 and 39. In the embodiments shown in the figures, each hinge is constituted by a torsion bar.

The bar 38 is suspended above the substrate 6. It extends along the axis 12 from the distal end of the branch 24 up to an anchoring protrusion 40. The protrusion 40 is fixed with no degree of freedom to the substrate 6.

In this description, a torsion bar designates a bar shaped so as to get deformed essentially in torsion about a rotation axis during the use of the device 2. For example, in the case of the bar 38, the rotation axis is the axis 12. To this end, the bar 38 is shaped so that its stiffness in bending or flexure in the directions orthogonal to the rotation axis is at least five or six times greater than its stiffness in torsion measured or computed at the same point. For example, to this end, the width $La_{38}$ of the bar 38 in the direction Y, is at least twice or five times smaller than the width $La_{24}$ of the branch 24. Preferably, the thickness $e_{38}$ of the bar 38 is equal to the thickness $e_{CR}$ to facilitate the passage of an electrical track.

In this embodiment, the bar 38 also electrically connects one of the ends of the conductor 32 to a fixed electrical connection pad 42. Here, the pad 42 is situated at an upper end of the protrusion 40 and is electrically insulated from this protrusion by a layer 44 made out of electrically insulating material. To fulfill this function, the bar 38, at its upper part, comprises an electrical track 46 which passes through it from side to the other. An electrically insulating layer is positioned between this electrical track 46 and the semi-conductive part of the bar 38.

The bar 39 extends along the axis 12 from the distal end of the branch 26 up to an anchoring protrusion 50. For example, the bar 39 is identical to the bar 38. Here, the pad, the layer made of insulating material and the conductive track, corresponding respectively to the pad 42, the layer 44 and the track 46, respectively bear the references 52, 54 and 56.

The pads 42 and 52 are electrically connected by means of a wire link to a current source 58. Here, the source 58 is an alternating current source.

The device 2 also comprises two strain sensors 60 and 62 to measure the angular displacement of the frame 10 about the axis 12. In this embodiment, the sensors 60 and 62 are strain gauge sensors. The strain gauge of the sensor 60 is a suspended piezoelectric beam or wire 64 to convert the angular shift of the frame 10 into a measurable variation of resistance. This beam 64 comprises:
- an anchored end 66 with no degree of freedom at the vertical bottom of the notch 28,
- an end 68 anchored with no degree of freedom in a bump 70 of the substrate 6, and
- a central part 69 suspended above the substrate 6.

The thickness of the beam 64 is at least two, five or ten times smaller than the thickness of the branch 24 so as to concentrate the strain exerted by the branch 24 within a limited surface area, thus increasing the sensitivity of the device 2. This also decreases its stiffness under tension-compression. Here, the width and possibly the length of the beam 64 are for example smaller than 10 or 5 µm.

For example, the beam 64 is made out of silicon or SiGe, which is an alloy of silicon and germanium. It can also be made out of metal. More generally, it can be made out of any material, the piezoresistive sensitivity of which, expressed by the ratio (dR/R)/(dl/l), is equal to or greater than the sensitivity of the materials referred to here above, where:
  dR is a variation of resistance of the beam 64,
  R is the resistance of the beam 64 at rest, i.e. when there is no strain,
  dl is the variation of the length of the beam 64 when it is subjected to a strain to be measured,
  l is the length at rest of the beam 64. *

Here, the beam 64 extends in parallel to the direction Y. The end 66 is situated above or beneath a horizontal plane passing by the axis 12. For example, here, the end 66 is situated beneath this horizontal plane (FIG. 2) and the beam 64 extends entirely beneath this horizontal plane, i.e. its upper face is spaced out from this horizontal plane by a distance that is not zero. In FIG. 2, only one part of the arm 18 extending on the horizontal plane passing through the axis 12 is shown in order to improve the readability of this figure.

The end 66 is situated as closely as possible to the axis 12 in order to obtain the maximum benefit of an amplification effect and of a purely tensile/compressive strain on the beam coming from the Laplace force caused by the arm 18. To this end, the shortest distance $d_p$ (FIG. 2) between the end 66 and the axis 12 is smaller than $e_{CR}/2$ and preferably smaller than $e_{CR}/3$ or $e_{CR}/5$. For example, this distance is smaller than 5 or 10 µm.

The sensor 60 also has two electrical pads 72 and 74 and an ohmmeter 76. The pads 72 and 74 are directly electrically connected, respectively, to the ends 66 and 68 of the beam 64. Here, the term "directly" designates the fact that the connection does not pass through the beam 64 or the ohmmeter 76.

The term "ohmmeter" is herein understood to mean any type of device capable of directly or indirectly measuring a variation in resistance. In practice, it is possible for example to use a measurement of voltage through a Wheatstone bridge. Preferably, the sensors 60 and 62 are integrated for this purpose into a Wheatstone half-bridge.

The pad 74 is electrically connected to the end 66 by means of the torsion bar 38.

The ohmmeter 76 is electrically connected to the pads 72 and 74 by means of wire links. This ohmmeter 76 measures the variation in resistance of the beam 64 in response to the strain exerted on it by the lever 18 and generates a measuring signal representing the resistance measured.

The other sensor 62 is identical to the sensor 60 except that it measures a shift of the same amplitude as does the sensor 60 but in an opposite direction because its suspended beam is situated on the other side of the vertical plane passing through the axis 12. Here, the beam, the bump, the electrical pads and the ohmmeter of the sensor 60 corresponding to the beam 64, the bump 70, the pads 72, 74 and the ohmmeter 76 respectively carry the references 80, 82, 84, 86 and 90.

The sensors 60 and 62 are connected to an electronic processing unit 94. The unit 94 is programmed to compute the amplitude of the component $B_Y$ according to the measurement signals delivered by the sensors 60 and 62. To simplify the illustration, the connection between the unit 94 and the sensors is not shown.

The frequency $f_R$ of mechanical resonance of the device 2 is essentially set by the frame 10, the torsion bars 38, 39 and the beams 64, 80. Here, the dimensions of the frame 10, the torsion bars 38, 39 and the beams 64, 80 are chosen so that the frequency $f_R$ is greater than 1 kHz and preferably greater than 10 kHz. Through the architecture of the device 2, the dimensions of one of the elements of the device can be modified in order to set this frequency $f_R$ without modifying the other elements, thus greatly facilitating the mechanical optimization of the device 2.

FIG. 2 provides for a clearer understanding of the reason why the Laplace force is amplified by the lever effect in the device 2. The Laplace force is exerted at the end of the arms 18 and 19 in opposite directions on either side of the rotation axis 12. This makes the branch 24 rotate about the axis 12. Since the end 66 of the beam 64 fixedly attached to the branch 24 is situated beneath the axis 12, the rotation of the branch 24, in the case represented, essentially exerts a tensile force $F_t$ on the beam 64. Besides, since the frame 10 is rigid and since the torsion bar 38 constitutes a rotation axis that is fixed relative to the substrate 6 and since the distance d between the point of application of the force F and the axis 12 is several times greater than the distance $d_p$ between the end 66 and the axis 12, the force $F_t$ is several times greater than the Laplace force F because of the lever effect. This increases the sensitivity of the device 2.

The operation of the device 2 is as follows. The source 58 generates an alternating current at the frequency $f_A$ advantageously equal to the resonance frequency $f_R$. The Laplace force is exerted on the conductor 32 sometimes in the direction Z and sometimes at the opposite direction. This excites the device 2 at this frequency $f_A$. The frame 10 then oscillates about the axis 12 at the frequency $f_A$. The angular amplitude of these oscillations represents the Laplace force that is exerted and therefore the amplitude of the component $B_Y$. The sensors 60 and 62 generate measurement signals representing the amplitude of the angular displacement of the frame 10 and transmit these signals to the unit 94. The unit 94 computes the amplitude of the component $B_Y$ of the magnetic field from these signals.

FIGS. 3 to 9 represent different successive steps of manufacture of the device 2. FIGS. 3 to 9 are views in vertical section of different elements of the device 2. These different elements have been juxtaposed in these views even if they are not beside each other in the device 2. Thus, these views do not correspond to a section of the device 2 along a section plane but illustrate simply the manufacturing of the different elements without taking account of their layout relative to one another in the device 2.

The manufacturing starts with the supply of an SOI (silicon-on-insulator) substrate. This substrate comprises the substrate 6, a layer 120 (FIG. 3) made out of an electrically insulating material such as silicon oxide and a layer 122 (FIG. 3) of silicon. For example, the layers 120 and 122 respectively have thicknesses equal to 1 µm and 0.3 µm.

Figure 3:
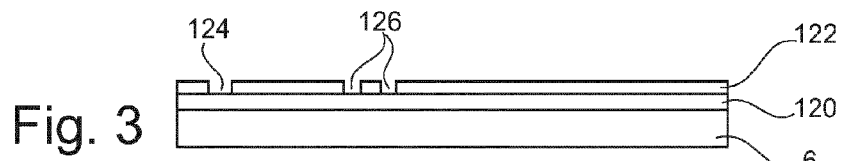
FIGS. 3 to 9 are schematic illustrations of different steps for manufacturing the measuring device of FIG. 1.
Figure 4:
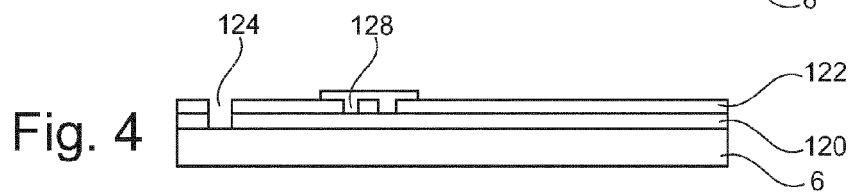
Figure 5:
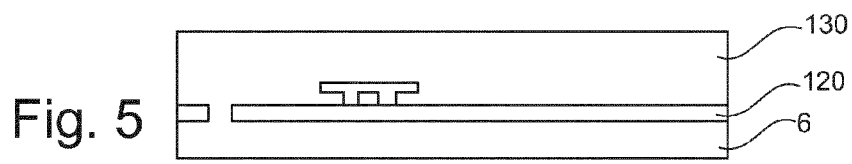
Figure 6:
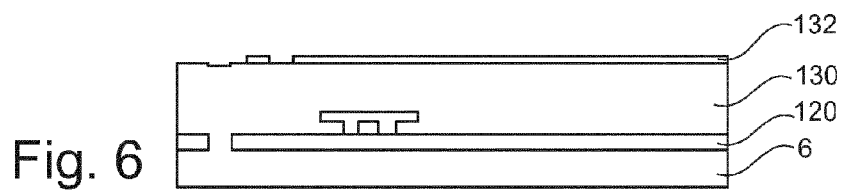
Figure 7:
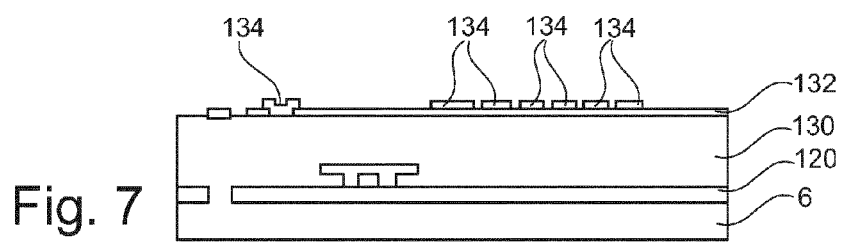
Figure 8:
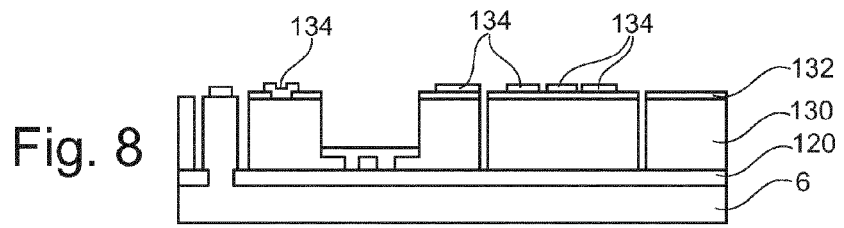
Figure 9:
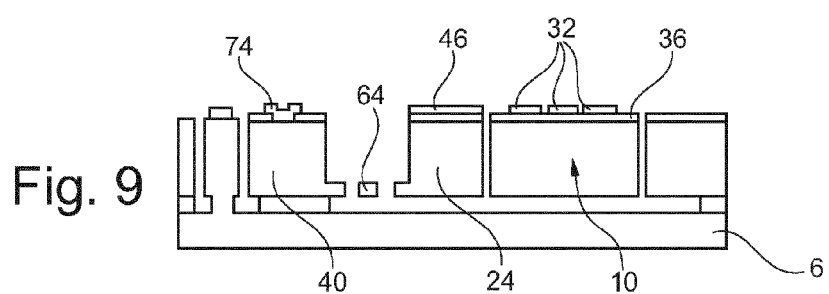

Then, the layer 122 is etched by photolithography so as to form a hole 124 and two holes 126 (FIG. 3). The hole 124 is used to make a pad providing electrical contact with the substrate 6. Two holes 126 are used to make the piezoresistive beam 64 of the sensor 60.

Then, an oxide layer 128 (FIG. 4) is deposited on the layer 122. For example, the thickness of the layer 128 is 0.3 µm.

The layer 128 is etched by means of a photolithography method so as to leave only those parts of the layer 128 that fill and cover the two holes 126. This layer 128 is intended to cover and protect the beam of the strain sensor. During these etching steps, the oxide layer at the bottom of the hole 124 is also eliminated to leave the substrate 6 exposed to the exterior.

Then, a layer 130 (FIG. 5) of silicon is deposited on the layer 128. For example, this layer 130 is deposited by epitaxial growth on the layer 122 and on the remainder of the layer 128. This layer 130 forms a single unified layer with the layer 122 so that only the layer 130 has been represented. The thickness of the layer 130 is about 20 μm.

A layer 132 (FIG. 6) made out of electrically insulating material is then deposited on the layer 130. This layer 132 is then etched by photolithography at the locations where the formation of a direct electrical contact with the layer 130 is needed. For example, the layer 132 is a layer made of silicon nitride with a thickness of 0.1 μm.

A layer 134 (FIG. 7) made out of electrically conductive material is then deposited on the layer 132. For example, the layer 134 is a metal layer. This layer 134 is then etched to form the different pads and electrical tracks of the device 2.

Then, the layer 132 is etched (FIG. 8) by photolithography. The layer 130 is also etched by using the same resin mask and the oxide layers 120 and 128 as an etch stop layer. For example, the layer 130 is etched by means of a DRIE (deep reactive ion etching) method.

Finally, the oxide layer 120 and 128 are removed (FIG. 9) to release the different mobile parts of the device 2. For example, the oxide layers are removed by HF wet-etching and/or vapor-phase etching.

Figure 10:
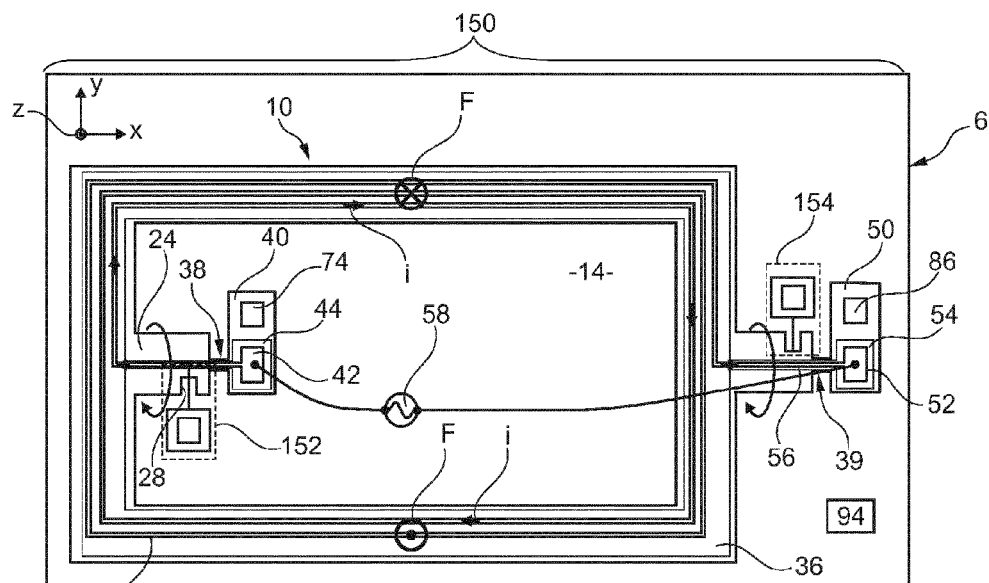
FIGS. 10, 12, 20 and 21 are schematic illustrations in a top view of other different possible embodiments of a Laplace force measuring device.

FIG. 10 represents a device 150 identical to the device 2 except that the sensors 60 and 62 are respectively replaced by resonant strain gauges 152 and 154. The sensors 152 and 154 are identical except that each of them measures a strain of the same amplitude as the strain measured by the other sensor but with an opposite sign. Thus, only the sensor 152 is described in greater detail with reference to FIG. 11.

The sensor 152 comprises a beam 160 suspended above the substrate 6. One end 162 of this beam is anchored, with no degree of freedom, in the axis of the beam, to the branch 24 at the bottom of the notch 28. The opposite end 164 of this beam is anchored, with no degree of freedom, to the bump 70. A mobile central part 166 of this beam is situated between the ends 162 and 164. This mobile part 166 is suspended above the substrate 6 so that it can vibrate. Typically, the beam 160 is made out of a semi-conductive or conductive material. Here, it is made out of silicon. However, it is not necessary in this embodiment that it should be made out of piezoresistive material.

The sensor 152 also comprises an actuating electrode 168 placed in proximity to the mobile part 166 to exert an electrostatic force on this mobile part that periodically draws it in the direction X. To make the central part vibrate, the electrode 168 is electrically connected through an electrical pad 170 to a terminal of a source 172 of AC voltage comprising a DC component. The AC voltage is generated at a frequency that is automatically slaved to the mechanical resonance frequency of the beam 160. To obtain this automatic slaving, the invention uses the fact that the amplitude of the vibrations of the beam 160 is the maximum when the beam vibrates at its resonance frequency. Another terminal of the source 172 is directly connected to the end 164 of the beam 160 by means of an electrical pad 174. Thus, the beam 160 vibrates at a frequency $f_0$.

The sensor 152 also comprises a measuring electrode 176 disposed so as to be facing the mobile part 166 to form, with the mobile part, a capacitor whose capacitance varies according to the shifting of the mobile part 166. The electrode 176 is electrically connected to a terminal of a capacitance meter 178 by means of an electrical pad 180. The other terminal of the capacitance meter 178 is connected to the pad 174. Thus, the capacitance meter 178 can be used to measure the amplitude and/or the vibration frequency of the mobile part 166. The resonance frequency $f_0$ varies as a function of the strain exerted by the branch 24 on the beam 160. The value of the frequency $f_0$ is thus used to measure the amplitude of the angular displacement of the branch 124 and therefore the amplitude of the component $B_Y$.

Figure 12:
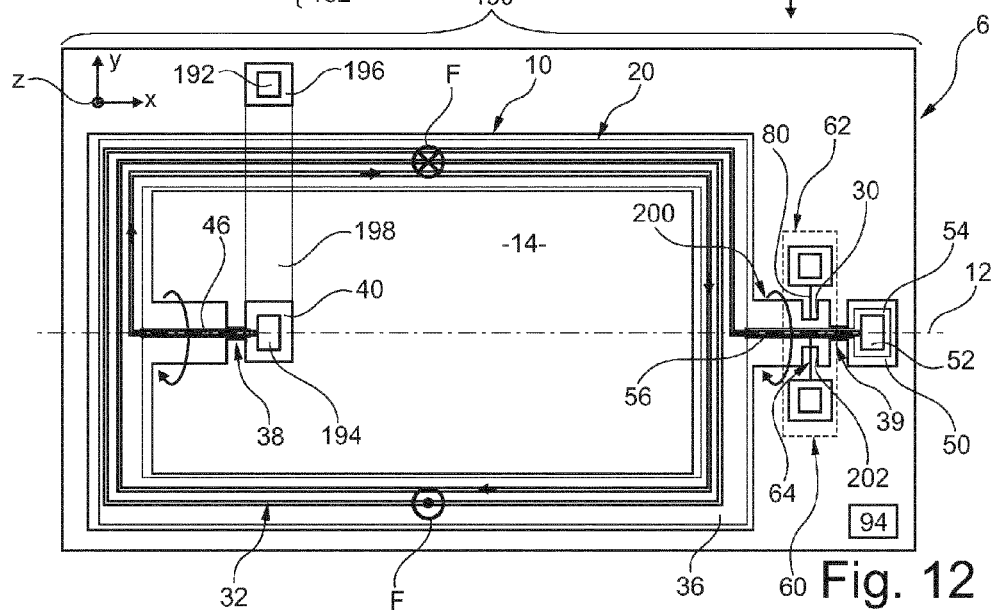

FIG. 12 represents a device 190 that is identical to the device 2, except that:
 the electrical connection of the conductor 32 is obtained not by means of a pad 42 situated inside the recess 14 but by means of an electrical pad 192 situated outside the recess 14, and
 the sensor 60 is shifted to the exterior of the recess 14.

The fact of moving all the electrical connection pads to the exterior of the recess 14 simplifies the electrical connection of the device 190. Indeed, it is no longer necessary to provide conductive wires that pass above the frame 10.

Here, the pad 42 is replaced by a pad 194 that is in direct electrical contact with the protrusion 40. To this end, the insulating layer 44 between the pad 194 and the protrusion 40 is omitted.

The protrusion 40 is electrically connected to a beam 196, situated outside the recess 14, by means of an electrical track 198. This track 198 is fixed, with no degree of freedom, to the substrate 6. Here, the track 198 passes beneath the leg 20 of the frame 10 to meet the protrusion 196. The leg 20 is therefore suspended above the track 198. The pad 192 is deposited on the upper end of the protrusion 196.

In this embodiment, the sensor 60 is placed so as to be facing the sensor 62. For example, the beam 64 is symmetrical with the beam 80 relative to a vertical plane passing through the axis 12. To this end, the branch 26 is replaced by a branch 200. The branch 200 is identical to the branch 26 except that it comprises, in addition, a notch 202 symmetrical with the notch 30 relative to the vertical plane containing the axis 12. The end of the beam 64 is fixed to the bottom of the notch 202. In these conditions, as here above, the sensor 60 measures an angular displacement of a same amplitude as the sensor 60 but of an opposite sign.

FIGS. 13 to 19 represent the different steps of manufacture of the device 190. These steps are identical to those described with reference to FIGS. 3 to 9 for all the elements of the device except for the making of the track 198 and the pads 192 and 196. More specifically, the steps implemented to obtain the different states of manufacture represented successively in FIGS. 13 to 19 are identical to those described with reference respectively to FIGS. 3 to 9 except that an additional portion 210 of the oxide layer 128 (see FIG. 14) is left to keep one portion of the layer 122 passing beneath the layer 10. As shown in FIG. 18, this portion 210 serves as an etching stop layer during the etching of the layer 130. Then, this portion 210 is removed at the same time as the rest of the layer 128 to release the different mobile parts (FIG. 19). The track 198 which passes beneath the frame 10 is then obtained.

To form the pads 194 and 196 in electrical contact with the track 198, the metal layer 134 is directly deposited on the layer 130 and then etched to demarcate the pads 194 and 196 (FIG. 17).

Figure 20:
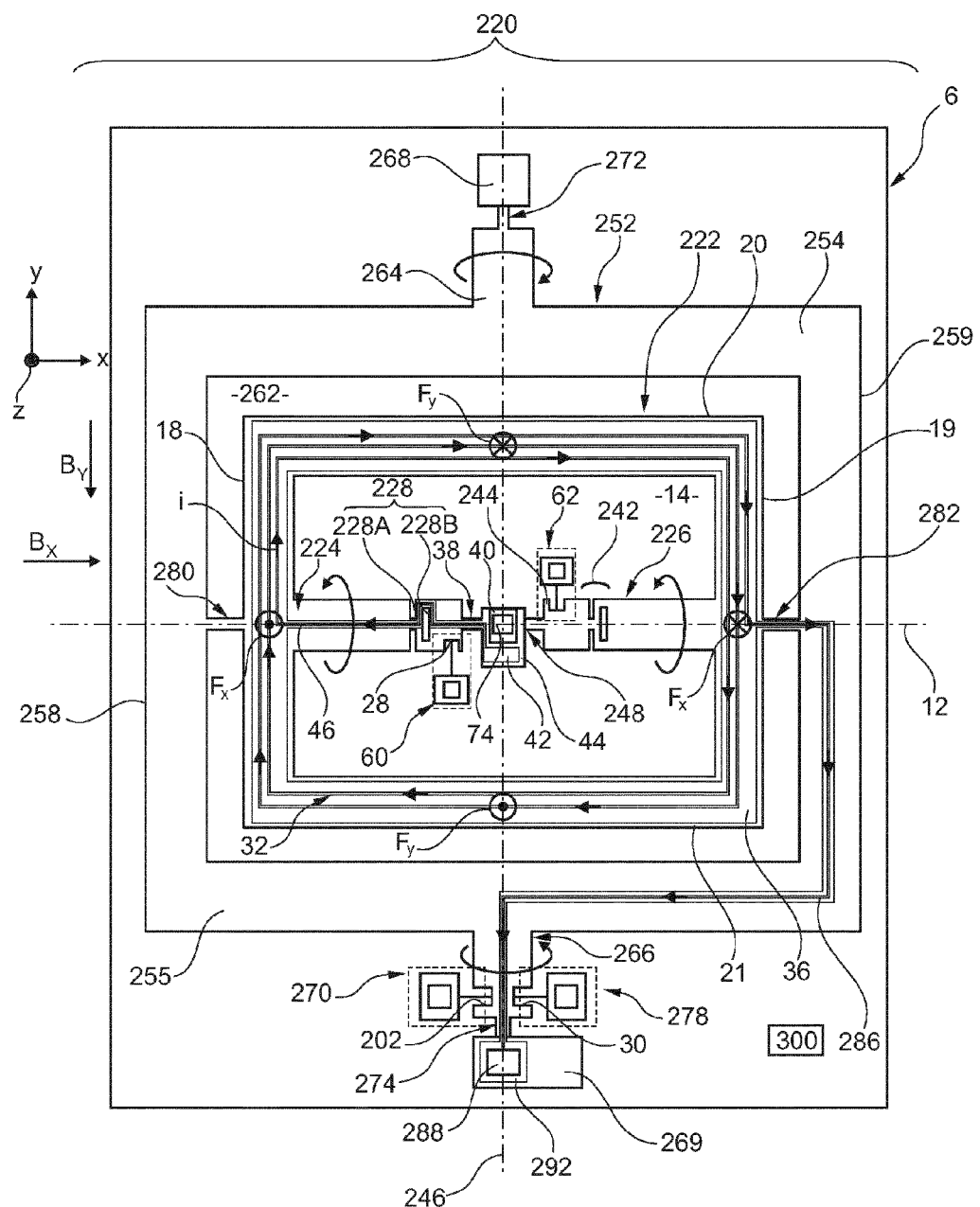

FIG. 20 represents a device 220 capable of measuring both components $B_y$ and $B_x$ of the magnetic field while, at the same time, using only one conductor, forming a coil with several turns, for this purpose. This device 220 comprises an internal frame 222 identical to the frame 10 except that the branches 24 and 28 are replaced respectively by branches 224 and 226. The branches 224 and 226 are situated inside the recess 14.

The branch 224 extends along the axis 12 of rotation of the frame 222. The branch 224 is shaped to be rigid in torsion about the axis 12 and flexible in bending in the direction Z. To this end, the branch 224 is identical to the branch 24 but additionally comprises a joint 228 that is rigid in torsion and flexible in bending along the direction Z.

In this embodiment, the joint 228 is made by combining successively a thinned feature 228A followed by a rectangular recess 228B. The thinned feature 228A locally reduces the width of the branch 224 in the direction Y. The width of this thinned feature 228A in the direction Y is denoted as $La_{228A}$. The thinned feature 228A is centered on the rotation axis 12.

The recess 228B is a rectangular recess passing from one side to the other of the branch 224 in the direction Z. The width of this recess, denoted as $La_{228B}$, in the direction Y is strictly greater than the width $La_{228A}$. The thinned feature 228A is more rigid in torsion than the torsion bar 38. To this end, in this example, its width $La_{228A}$ is at least twice the width $La_{38}$ or its length $Lo_{228A}$ in the direction X, is at least half the length $Lo_{38}$. Hence, the joint 228 is far more rigid in torsion than the bar 38. Thus, during a shift in rotation of the branch 224, it is almost exclusively the torsion bar 38 that gets deformed. The joint 228 reduces the stiffness of the branch 224 under bending in the direction Z. As a consequence, this allows the frame 222 to move rotationally also about a horizontal axis 246 perpendicular to the axis 12.

The end of the branch 224 is mechanically connected by means of the bar 38 to the protrusion 40. As above, the protrusion 40 comprises the pad 42 for the electrical connection of the electrical conductor 32 to the source 58 of alternating current. In this figure and the following figure, the source 58 has not been shown.

The branch 226 is structurally similar to the branch 224 except that it mechanically connects the arm 19 to the substrate 6 and not the arm 18 to the substrate 6. The joint and the notch of the branch 228 respectively bear the references 242 and 244. Here, the branch 226 is symmetrical with the branch 224 relative to a vertical plane passing through the axis 246 except that its notch 244 is situated on the other side of the vertical plane passing through the axis 12.

A torsion bar 248 mechanically connects the end of the branch 226 to the protrusion 40. The bar 248 is symmetrical with the bar 38 relative to the vertical plane passing through the axis 246.

The beam 80 of the sensor 62 is mechanically connected to the bottom of the notch 244 as described with reference to FIGS. 1 and 2. Unlike the branch 224, the branch 226 does not have any conductive track to connect the other end of the conductor 32 to the current source 58.

The Laplace forces which are exerted on the legs 20 and 21 when the conductor 32 is crossed by a current in the presence of the component $B_y$, are denoted $F_y$ in FIG. 20. The Laplace forces that get exerted on the arms 18 and 19 when the conductor 32 is crossed by a current in the presence of the component $B_x$ of the magnetic field are denoted as $F_x$ in FIG. 20.

The device 220 also comprises a suspended external rigid frame 252 mounted in rotation about the axis 246. This frame 252 holds the suspended frame 222 above the substrate 6. The frame 252 has two arms 254 and 255 parallel to the direction X and two legs 258 and 259 parallel to the direction Y. These arms and legs demarcate an internal, rectangular through-recess 262.

Each rigid arm 254, 255 has a rigid branch, respectively 264 and 266. These branches 264 and 266 extend along the axis 246, each moving away from the frame 252. The distal ends of these branches 264 and 266 are mechanically connected to protrusions, respectively 268 and 269, by means of torsion bars, respectively 272 and 274. The protrusions 268, 269 are fixed with no degree of freedom to the substrate 6.

These torsion bars 272 and 274, like the torsion bars 38 and 29, make it possible to maintain the suspended frame 252 above the substrate 6 while at the same time essentially permitting only a rotational motion of the frame 252 about the axis 246.

The branch 266 is disposed like the branch 200. It therefore comprises two notches 30 and 202 facing each other. Sensors 276 and 278 are planned to measure the angular displacement of the frame 252 about the axis 246. Here, the sensors 276 and 278 are identical respectively to the sensors 60 and 62. They are laid out so as to be facing each other as described with reference to FIG. 12.

The frame 252 is mechanically connected to the frame 222 by the torsion bars 280 and 282 extending along the axis 12. The torsion bar 280 mechanically connects the midpoint of the leg 258 directly to the midpoint of the arm 18. The torsion bar 282 mechanically connects the midpoint of the leg 259 directly to the midpoint of the arm 19.

The torsion bars 280 and 282 are used to maintain the frame 222 suspended above this substrate 6 while at the same time leaving this frame 222 free to move rotationally about the axis 12.

The structure of the frame 252 and of the torsion bars 280 and 282 is designed to amplify the Laplace forces $F_X$ through a lever effect of the arms 254 and 255. To this end, the frame 252 and the bars 280, 282 are made as described with reference to the frame 10 and the bars 38 and 39.

An electrical track 286 connects the other end of the conductor 32, not directly connected to pad 42, to a connecting pad 288 situated above the extremity of protrusion 269. The pad 288 is electrically insulated from the protrusion 269 by a layer 292 made out of an electrically insulating material.

Here, the track 289 is deposited successively on the torsion bar 282, on the leg 259, on the arm 255, on the arm 266 and on the torsion bar 274 and then reaches the pad 288. In this embodiment, the leg 258 and the arm 254 are without electrical conductor.

The rotational shift around the axis 246 of the frame 252 is prompted by the Laplace forces $F_X$ which are exerted on the conductor 2 when it is crossed by a current in the presence of the component $B_x$. Thus, one and the same electrical conductor forming a coil is used to measure both components $B_x$ and $B_y$ of the magnetic field. This notably reduces the electrical consumption of the device 220.

The device 220 also comprises an electronic processing unit 300 connected to the different sensors of the device 220 to convert the signals of these sensors into a measurement of the intensity of the components $B_x$ and $B_y$.

The working of the device 220 is similar to that of the device 2 and will not be described in greater detail. In particular, it can be noted that the device 220, through the lever effect, amplifies the Laplace forces $F_Y$ as well as $F_X$.

Figure 21:
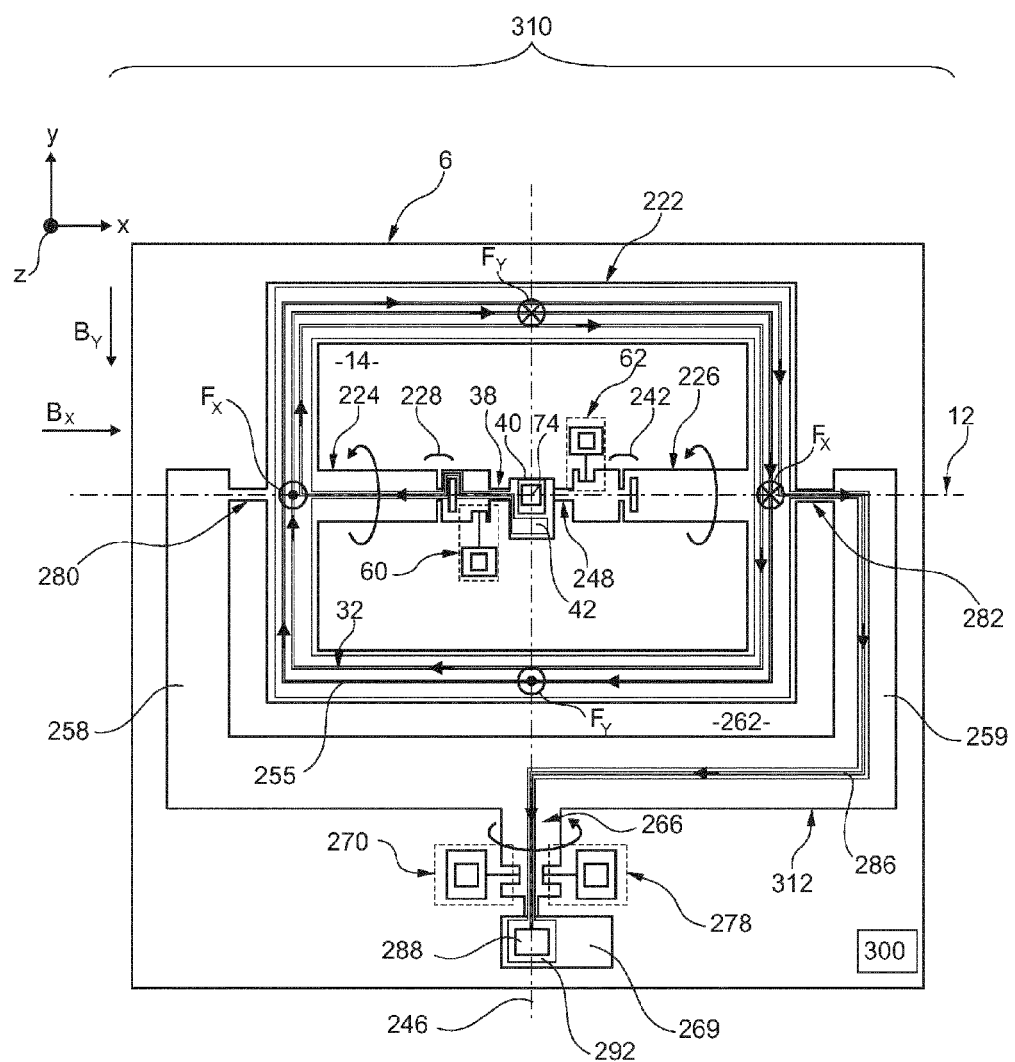

FIG. 21 shows a device 310 identical to the device 2 except that the frame 252 is replaced by a rigid frame 312. The frame 312 is identical to the frame 252 except that the arm 254 is omitted and the length of the legs 258 and 259 is shortened. The branch 264, the torsion bar 272 and the protrusion 268 are also omitted.

This device 310 works like the device 220.

Many other embodiments are possible. For example, as illustrated by the FIGS. 20 and 21, the magnetic field measuring device can comprise one or more axes of measurement. Thus, the measurement device can be a single-axis or multiple-axis device.

To increase precision, each of the devices previously described can be enclosed in a box within which a vacuum is set up. This especially raises the quality factor of the mechanical system. However, depending on the applications and the desired sensitivity, this is not obligatorily necessary.

Whatever the embodiment concerned, the electrical conductor can form only one turn or on the contrary can form several full turns.

The current that flows in the electrical conductor is not necessarily an alternating current. As a variant, it is a current that varies non-sinusoidally in time or it can be a DC current that never changes its sign.

Similarly, it is not necessary that the sensors measuring the amplitude of the angular displacement of the lever should be mounted differentially. Thus, in one simplified variant, the device has only one sensor to measure the angular displacement of the lever.

The ohmmeter can be replaced by any means for measuring an electrical resistance such as for example a Wheatstone bridge.

When a resonant strain gauge is used, one and the same electrode can be used both to make the beam resonate and to measure the vibration frequency of this beam.

The capacitance meter can be replaced by any means for measuring the frequency of vibration of the beam of the resonant strain gauge.

As a variant, the axes 12 and 246 are not perpendicular to each other. However, these two axes are not parallel to each other either.

The external rigid frame 252 can comprise an electrical conductor wound about its central recess 262. In this case, preferably, this conductor is connected in series with the electrical conductor 32 and replaces the track 286.

The electrical conductor 32 can be powered by means of the torsion bar 248 even when it comprises the external frame 252. In this case, the electrical track 286 is omitted.

The angular displacement of the frame 10, 222 or 252 can be measured by means other than a sensor comprising a suspended beam. For example, the angular displacement is measured by a capacitive sensor as described in the following article A2:

J. KYYNÄRÄINEN, "*A 3D micromechanical compass*", Sensors and Actuators A, volume 142, pages 561 to 568, 2008.

Figure 11:
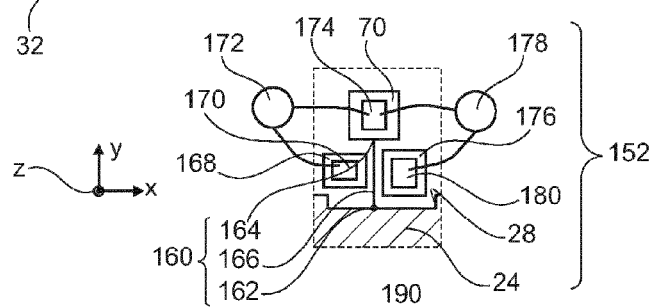
FIG. 11 is a schematic illustration of a resonant strain gauge used in the embodiment of FIG. 10.

The resonant strain gauge 152 described with reference to FIG. 11 can be used in place of a strain gauge sensor in all the other embodiments described here above.

Many other embodiments of hinges are possible. For example, a torsion bar can be made as described in the patent application filed in 2011 under number FR1161487. A hinge can also be made without using the torsion bar. For example, two flexible horizontal strips flexible in the direction Z and positioned so as to be facing each other on either side of the rotation axis can be used to set up a hinge.

In another embodiment, the thickness $e_{38}$ of the torsion bar 38 is at least two or five or ten times smaller in the direction Z, than the thickness $e_{CR}$ of the branch 24.

Preferably, the bottom of the notches, such as the notch 28, is contained in the plane perpendicular to the plane of the frame passing through the rotation axis of this frame.

As described with reference to FIG. 21, in all the embodiments described here above, the mobile frame can be suspended above the substrate by means of a single hinge.

Weights can be added to the mobile frame so as to move its center of gravity away from the axis 12. In so doing, the mobile frame is made also sensitive to the accelerations. Then, the processing unit is programmed to eliminate all the frequency components, for example below 1000 Hz, from the measurement signal. The signal thus filtered is then used to determine the intensity of the component of the magnetic field measured. The same signal can also be filtered in parallel to eliminate all the frequency components above 1000 Hz. This filter signal is then used to measure the acceleration undergone by the mobile frame. The weight can be a protuberance of material in the direction Y on one of the legs of the frame. In this case, the frame is made sensitive to accelerations parallel to the direction Z. The weight can also be a protuberance of material situated in the plane perpendicular to the plane of the frame passing through the axis 12. In this case, the frame is made sensitive to accelerations along the direction Y.

If the conductor forms only one turn, the recess at the center of the frame can be omitted.

In another variant, the beam of the strain sensor extends in parallel to the direction Z between one end anchored in the substrate 6 and another end directly anchored in the lower face of one of the arms of the mobile frame.

The invention claimed is:

1. A device for measuring magnetic fields with Laplace force, this device comprising:
    a substrate extending essentially in a plane called the "plane of the substrate",
    a first rigid frame extending essentially in a plane called the "plane of the first frame" and suspended above the substrate, the first frame being moveable relative to the substrate in rotation about a first rotation axis parallel to the plane of the substrate, and the first rigid frame comprising a central through-recess,
    a fixed electrical conductor fixed, with no degree of freedom, to the first rigid frame, the fixed electrical conductor being wound about a winding axis perpendicular to the plane of the first frame,
    at least one first hinge mechanically connecting the first rigid frame to the substrate, the at least one first hinge comprising a first electrical track electrically connecting a first end of the fixed electrical conductor and a first connection pad fixedly attached to the substrate,
    a second hinge mechanically connected to the first rigid frame and comprising a second electrical track electrically connecting a second end of the fixed electrical conductor to a second connection pad fixedly attached to the substrate, and
    at least one first sensor capable of measuring a physical quantity representing the amplitude of the angular displacement of the first rigid frame about said first rotation axis, wherein:
        the at least one first hinge and the first electrical track are situated inside the central recess of the first rigid frame, and
        the second hinge and the second electrical track are situated outside the central recess of the first rigid frame.

2. The device according to claim 1, wherein the at least one first sensor is a strain sensor, and the strain sensor comprises a beam, a first end of which is directly anchored in the first rigid frame and a second end of which is anchored, with no degree of freedom, to the substrate, the first end being anchored in the first rigid frame, at a non-zero distance dp from the first rotation axis, this distance dp being at least twice as small as the thickness of the first frame and the thickness of the beam being at least twice as small as the thickness of the first rigid frame.

3. The device according to claim 2, wherein the beam is entirely disposed beneath a plane parallel to the plane of the substrate and passing through the rotation axis.

4. The device according to claim 2, wherein the first rigid frame comprises at least one rigid lateral branch extending along the first rotation axis and the beam is suspended above the substrate, the beam extends perpendicularly to the first rotation axis essentially in a plane parallel to the plane of the substrate and the first end being:
- situated strictly above or strictly beneath a plane passing through the first rotation axis and parallel to the plane of the substrate, and
- directly fixed to the lateral branch.

5. The device according to claim 4, wherein the lateral branch comprises a notch extending perpendicularly to the first rotation axis until a bottom, and the first end of the beam is directly fixed with no degree of freedom to this bottom.

6. The device according to claim 2, wherein the beam of the sensor is made out of piezoelectrical material and the sensor comprises means capable of measuring a physical quantity representing the variation of the resistance of the beam in response to the rotation of the first rigid frame.

7. The device according to claim 2, wherein the sensor comprises:
- a first electrode capable of making the beam vibrate,
- a second electrode, wherein the first or second electrodes measure the vibration of the beam,
- means capable of measuring a physical quantity representing the vibration frequency of the beam, and
- a source for powering the first and second electrodes capable of automatically slaving the vibration frequency of the beam to the mechanical resonance frequency of the beam.

8. The device according to claim 1, wherein the center of gravity of the first rigid frame is contained in a plane perpendicular to the plane of the first rigid frame and containing the first rotation axis.

9. The device according to claim 1, wherein the first rigid frame comprises a first rigid arm and a second rigid arm that are parallel, situated on either side of the central recess passing through the first rigid frame, and the second hinge mechanically connects the first rigid frame to the substrate, the first and second hinges being mechanically connected directly, respectively, to the first and second arms.

10. The device according to claim 1, wherein the first connection pad is situated outside the first rigid frame and the device comprises an electrical track passing beneath the first rigid frame and electrically linking the first electrical track of the first hinge to the connection pad fixedly attached to the substrate situated outside the rigid frame.

11. The device according to claim 1, further comprising:
- a second rigid frame extending essentially in a plane and suspended above the substrate, the second rigid frame being moveable relative to the substrate in rotation about a second rotation axis parallel to the plane of the substrate and not parallel to the first rotation axis, the second rigid frame comprising a central recess inside which the first rigid frame is received,
- at least one third hinge mechanically connecting the second rigid frame to the substrate,
- at least one second sensor capable of measuring a physical quantity representing the amplitude of the angular displacement of the second rigid frame about the second rotation axis, and
- the second hinge is suspended above the substrate and fixed, on one side, to the first rigid frame and, on an opposite side, to the second rigid frame, the second hinge being shaped to allow the rotation of the first rigid frame about the first rotation axis and keep the first rigid frame suspended above the substrate.

12. The device according to claim 1, wherein the winding axis passes through the central recess.

13. The device according to claim 1, wherein each of the first and second hinges enable the rotation of the first rigid frame about the first rotation axis comprises a torsion bar which extends along the first rotation axis, the torsion bar being shaped so as to be deformed essentially in torsion during the rotation of the first rigid frame.

14. The device according to claim 1, wherein the electrical conductor is wound several times about the first winding axis to form a coil with several turns.

* * * * *